United States Patent [19]
Born

[11] Patent Number: 5,613,070
[45] Date of Patent: Mar. 18, 1997

[54] SYSTEM FOR PROVIDING IMPROVED COMMUNICATION TO DATA AND COMPUTER COMMUNICATIONS NETWORK USING PARALLEL AND SERIAL COMMUNICATION BUSES AND MASTER AND LOCAL ROUTERS

[75] Inventor: Eng C. Born, Richardson, Tex.

[73] Assignee: Texas Instrument Incorporated, Dallas, Tex.

[21] Appl. No.: 473,612

[22] Filed: Jun. 7, 1995

Related U.S. Application Data

[62] Division of Ser. No. 306,557, Sep. 15, 1994.

[51] Int. Cl.$^6$ .............................. G06F 15/80; G06F 13/20
[52] U.S. Cl. .............................. 395/200.15; 395/200.02; 395/800; 370/400
[58] Field of Search .............................. 395/200.1, 200.2, 395/200.15, 800; 370/85.9, 94.3

[56] References Cited

U.S. PATENT DOCUMENTS

| | | | |
|---|---|---|---|
| 4,536,873 | 8/1985 | Leete | 370/85 |
| 4,570,220 | 2/1986 | Tetrick et al. | 364/200 |
| 4,807,109 | 2/1989 | Farrell et al. | 364/200 |
| 5,165,023 | 11/1992 | Gifford | 395/325 |

OTHER PUBLICATIONS

"High Speed Serial Communications for Control Systems", Mathieson et al, 1993 IEEE, pp. 1826–1828; Jan. 1993.
"High Speed Serial Data Modem with Modified Viterbi Decoders", Guidotti et al, 1994 IEEE, pp. 159–163. Jul. 1994.

*Primary Examiner*—Thomas C. Lee
*Assistant Examiner*—Rehana Krick
*Attorney, Agent, or Firm*—Kay Houston; James Brady; Richard L. Donaldson

[57] ABSTRACT

This is a method and system of communicating on a data and computer communications network. The method of communications for a data and computer communications network, wherein the network includes a master system board with a plurality of subsystem boards, may comprise: transmitting informational packets to a network node from a first serial communications device through a serial communications bus, wherein the first serial communications device resides on a first subsystem board of the plurality of subsystem boards; receiving informational packets to the network node from the first serial communications through the serial communications bus; transmitting and receiving informational packets from the first serial communications device to a second serial communications device through a first parallel communications bus; and transmitting and receiving informational packets from the first serial communications device to a third serial communications device on a second subsystem board of the plurality of subsystem boards through a second parallel communications bus. The system includes a serial communications device for use in the data and computer communications network, wherein the device may have a transmitter with a memory buffer, a first medium access controller, a receiver with a memory and second medium access controller. The system may also include a parallel communications device with a communications interface and a memory on one subsystem board that communicates to other subsystem boards. The system may also include a router.

8 Claims, 8 Drawing Sheets

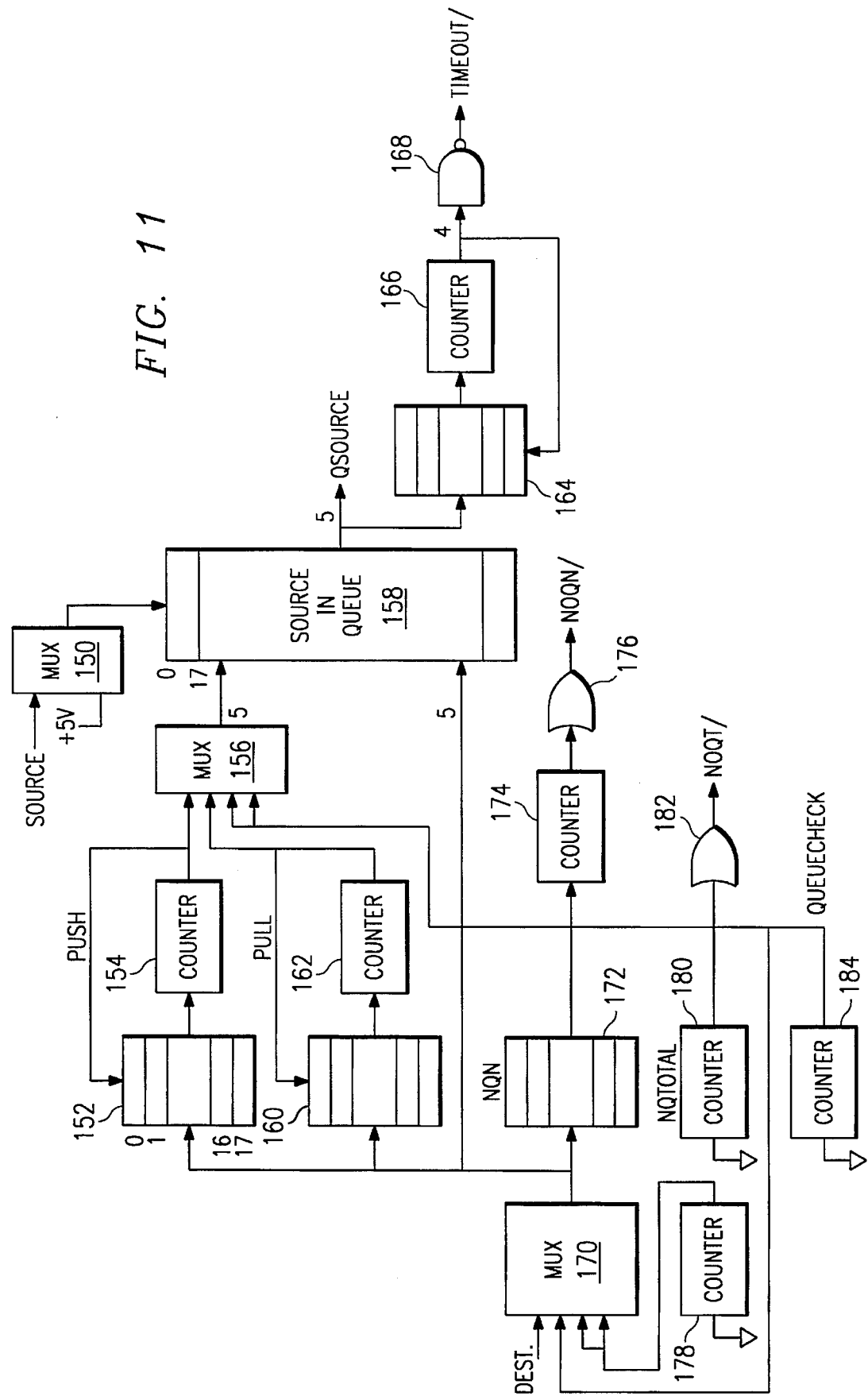

SYSTEM FOR PROVIDING IMPROVED COMMUNICATION TO DATA AND COMPUTER COMMUNICATIONS NETWORK USING PARALLEL AND SERIAL COMMUNICATION BUSES AND MASTER AND LOCAL ROUTERS

This is a divisional of application Ser. No. 08/306,557, filed Sep. 15, 1994, still pending.

FIELD OF THE INVENTION

This invention relates to the field of data and computer communications, more particularly, the field of data and computer communications architecture.

BACKGROUND OF THE INVENTION

Without limiting the scope of the invention, its background is described in connection with data and computer communications.

The 1970's and early 1980's saw a merger of the fields of computer science and data communications that profoundly changed the technology, products and companies of the now combined computer-communications industry.

Computers and other electronic equipment need a method of connection and method of communicating in order to transfer information back and forth. The method of connection is referred to as a communications network architecture or topology. The method of communicating is referred to as a communications protocol. There are many existing methods of communicating and also many methods of connecting computer and electronic devices. But, these methods allow only a few devices to talk at any given time. This means that these devices have to take turns to communicate to each. These existing solutions to the data communications problems are limiting the present data and computer technologies.

In addition, the data and computer communications field is an ever developing field. With computer technology rapidly advancing, the requirements of communications networks are also growing by leaps and bounds. Ethernet, token ring and other existing local area network protocols will not be able to meet the needs of future data and computer communications. The advent of graphic processing such as Xwindows and imaging servers is stretching the existing technologies to their limits. The emergence of new medias, such as fiber optics, is only part of the solution that is needed to respond to demands of these and other not yet developed technologies. In addition to new media, a faster communications protocol and network architecture is also needed to process tomorrow's communication needs.

In addition, the rapidly developing field of parallel processing is also a computer field that requires many computing elements to communicate with each other at the same time. Neural networks are a subdivision of parallel processing. Neural networks often have many processing units (e.g. microprocessors) that require constant communication. The problems and solutions to the architecture and topology of computer networks may sometimes be adaptable to neural networks, since they are in a sense, smaller computer networks within a larger computer.

SUMMARY OF THE INVENTION

Most computer networks allow only a few units to transmit data at a given time. Accordingly, improvements which increase the communication speed are presently desirable.

It is herein recognized that a need exists for a data communications network which will increase the rate of communication. The present invention is directed towards meeting those needs.

Generally, the present invention may combine fiber optic and BiCMOS technology. A store-and-forward packet switching network using multiple basic topologies would allow at least 50% of all units to transmit their data simultaneously. A modified tree structure is employed to organize the network. Each control unit is remote from the processing units and communicates with it via, a local bus, or point-to-point fiber optic or coaxial cable. A variety of shared intelligent peripheral devices and controllers can physically reside in the control unit if a slot is available in the mother board. The processing unit can be a microprocessor, disk concentrator, a diskless workstation, a super computer or a variety of other intelligent processing systems.

The network organization and operation is similar to the U.S. Post Office. The mother board at the bottom of the tree is like the local post office. Both have 256 mailboxes for customers, organized as sixteen rows of sixteen mailboxes. Each mailbox has two slots in it: one for outgoing and one for incoming messages. A PostMaster serves 16 customers. Two additional mailboxes are provided for each PostMaster. The first one can be used for incoming and outgoing out-of-town messages. The second mailbox serves the local customers that are not one of PostMaster's sixteen customers. A seventeenth PostMaster helps his/her 16 coworkers from leaving his or her post by providing service for the local 16 groups of customers.

Parallelism, high speed bus and hardware recursion are implemented at every level of the tree. Every 256 units have 16 independent serial channels that can be used to simultaneously transmit or receive the packets to or from other units which do not belong to their group. Within their group, 16 parallel independent channels are 16 to 25 times faster than the serial one, and will meet most throughput requirements. In efforts to localize the network, the 256 units are further divided into 16 subgroups of 16 printed circuit boards each with 16 independent parallel channels to move the packet from one unit to another within its subgroup. Hardware recursion propagates from this point upward through each level of the tree.

This is a method and system of communicating on a data and computer communications network. The computer communications system can contain multiple levels with a highest and a lowest level, each level comprising: a master board; a plurality of first type printed circuit boards connected to the master board by a first communications bus; and a second type printed circuit board connected to the master board and the plurality of first type printed circuit boards by the first communications bus. The first type printed circuit board may include: a communication device which connects to other such devices on other the first type boards by the second communications bus; a plurality of other communication devices connected to each other and the communication device by a third communications bus; and a local routing device which is connected to the and the plurality of other devices by the third communications bus, wherein the local routing device is also connected to other such local routing devices on other the first type boards by the first communications bus. The second type printed circuit board may include: a central processing unit; and a central muting device connected to the central processing unit and connected to the local routing devices on the first type printed circuit boards by the first communications bus.

The system could be used for parallel processing, neural networks, local area, as well as wide area networks, graphics processing, and disk array technology. Generally, the invention can be used wherever a requirement for high speed communication between computing devices exists.

Other devices, systems and methods are also disclosed.

BRIEF DESCRIPTION OF THE DRAWINGS

The foregoing and further aspects of the invention are illustrated in the accompanying drawings wherein like elements are denoted by like reference designators and in which:

FIG. 11 is a schematic diagram of a queue block.

DETAILED DESCRIPTION OF THE PREFERRED EMBODIMENTS

The detailed description is described in relation to a specific embodiment. Variations of the specific devices and methods described will be apparent to persons skilled in the an upon reference to the description. It is intended that those variations still encompass the spirit of the invention. Specific variations and modifications will be detailed at the end of the detailed description.

SECTION 1. GENERAL

Network Organization

Figure 1:
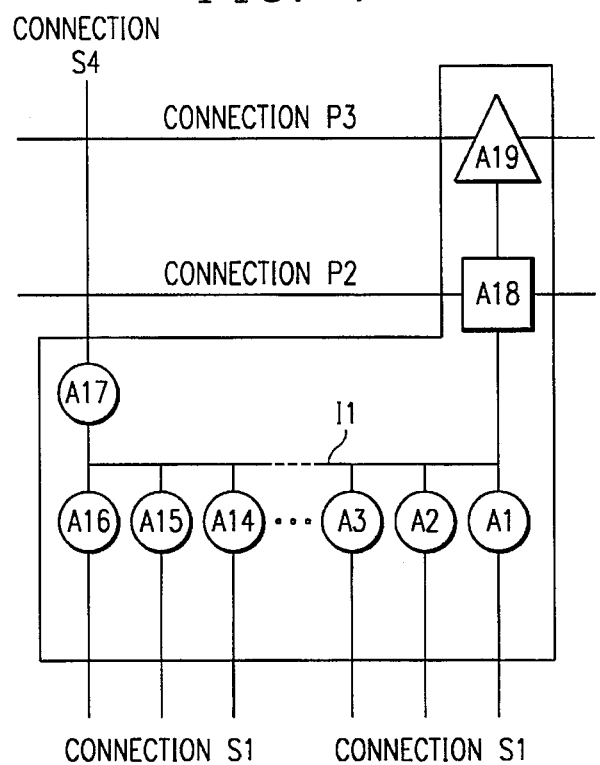
FIG. 1 is a block diagram of one printed circuit board of the invention.

All processing units (e.g. workstations) are connected to a network controller (printed circuit board) at the bottom of the tree. Only two types of printed circuit boards and one type of mother board are needed for each stage of the tree. The printed circuit boards are designed around three types of VLSI devices. The three devices are named PostSP, for devices with serial connections, PostPP for devices with parallel connections and PostMaster for the device that service the other devices. FIG. 1 shows the PostSPs 1–17 as circles, the PostPP 18 as a square, and the PostMaster 19 as a triangle, all of which are connected by internal bus I1. All other drawings will use the same convention. The PostSPs 1–16 connections to processing units by serial lines are depicted as Connection S1. PostSP 4–13 are not shown to avoid crowding. The PostPP is connected with other PostPPs on other boards by the parallel Connection P2. The PostMaster is connected to PostMasters on other boards by the parallel Connection P3. Connection S4 connects the last PostSP 17 serially to the next higher level.

Figure 2:
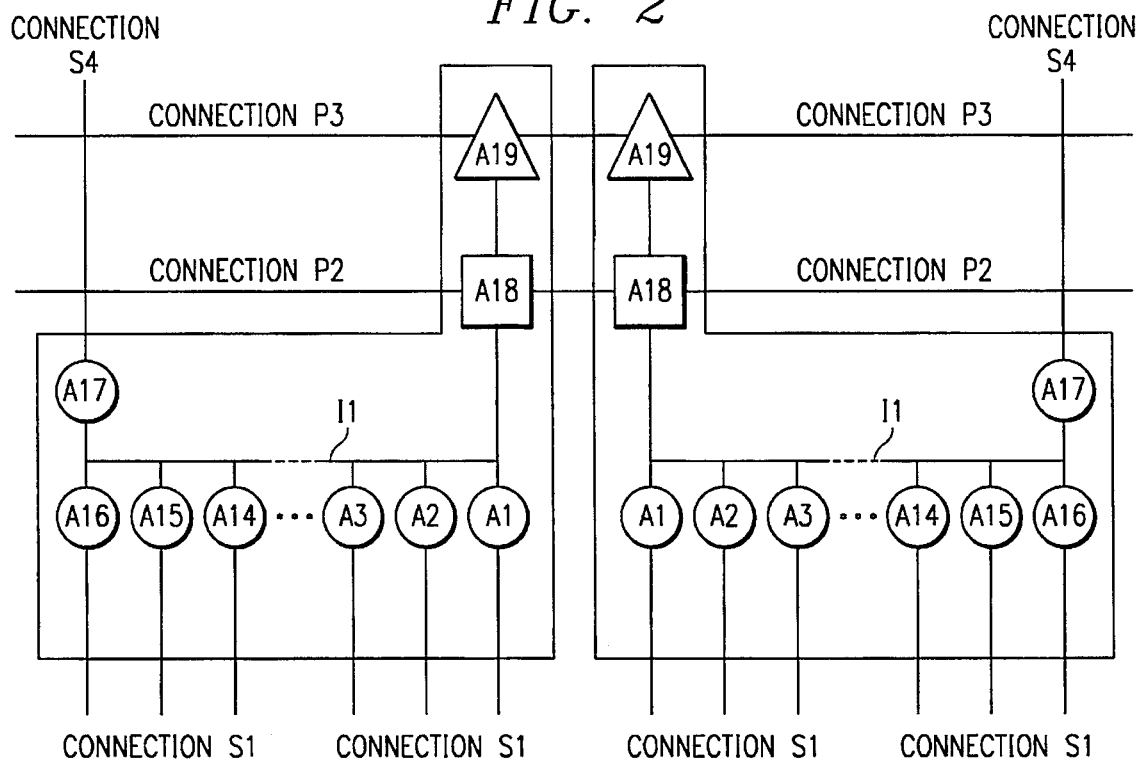
FIG. 2 is a block diagram of two printed circuit boards connected together.

FIG. 2 is an example of two printed circuit boards connected together. The same convention for depicting each device is used as in FIG. 1.

Figure 3:
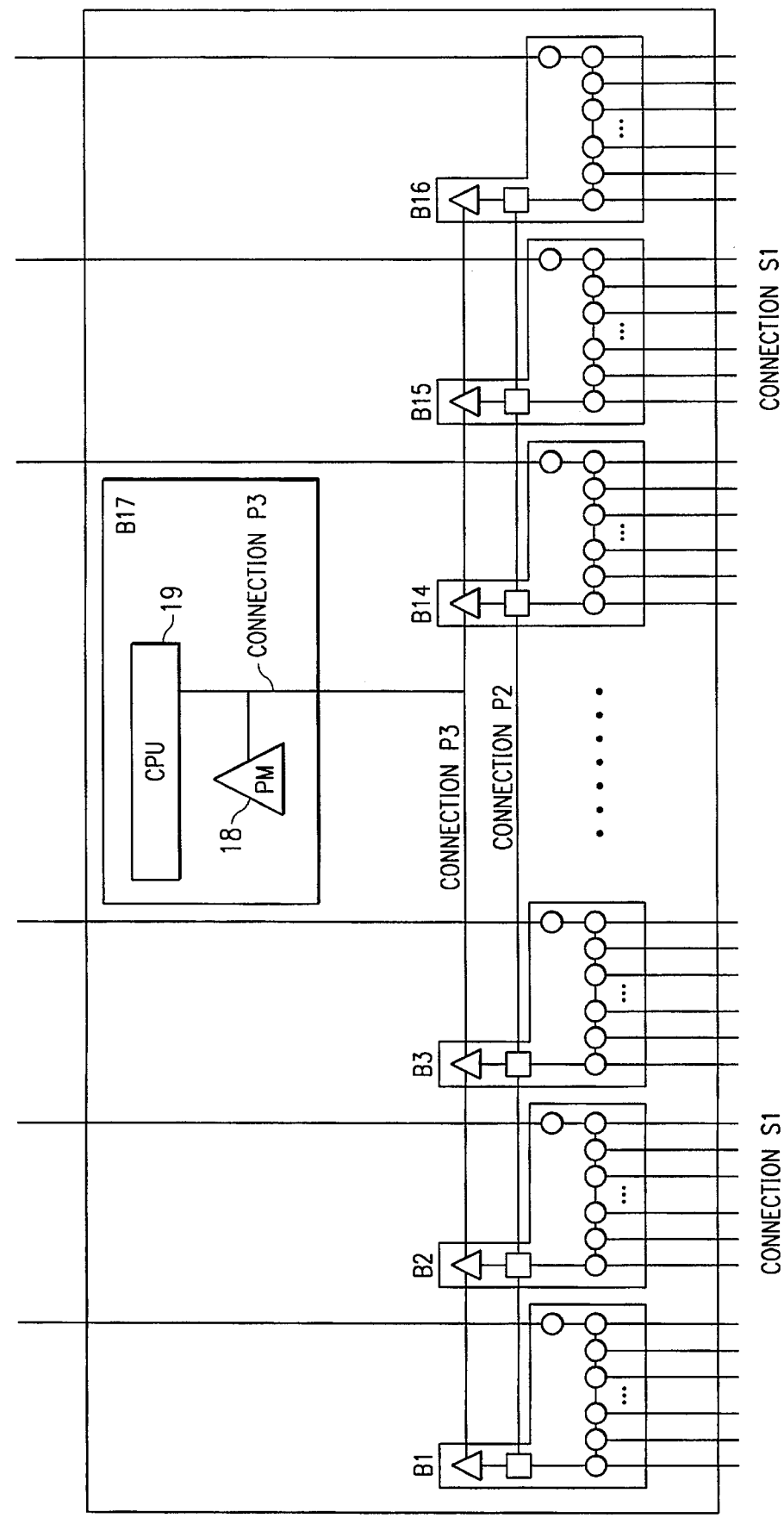
FIG. 3 is a block diagram of a mother board with 17 printed circuit boards.

FIG. 3 shows an example of a mother board with the associated printed circuit boards. Each mother board has seventeen slots: sixteen slots are for the first type of printed circuit board and one slot is for the second type. The other type of printed circuit board (CPU board) has the State PostMaster 18 and a 32 bit microprocessor 19. The State PostMaster 18 and the microprocessor 19 are both connected to the PostMasters on the sixteen printed circuit boards by parallel Connection P3. The figure shows boards 1–3 and 14–16, but omits boards 4–13 to avoid crowding.

Figure 4:
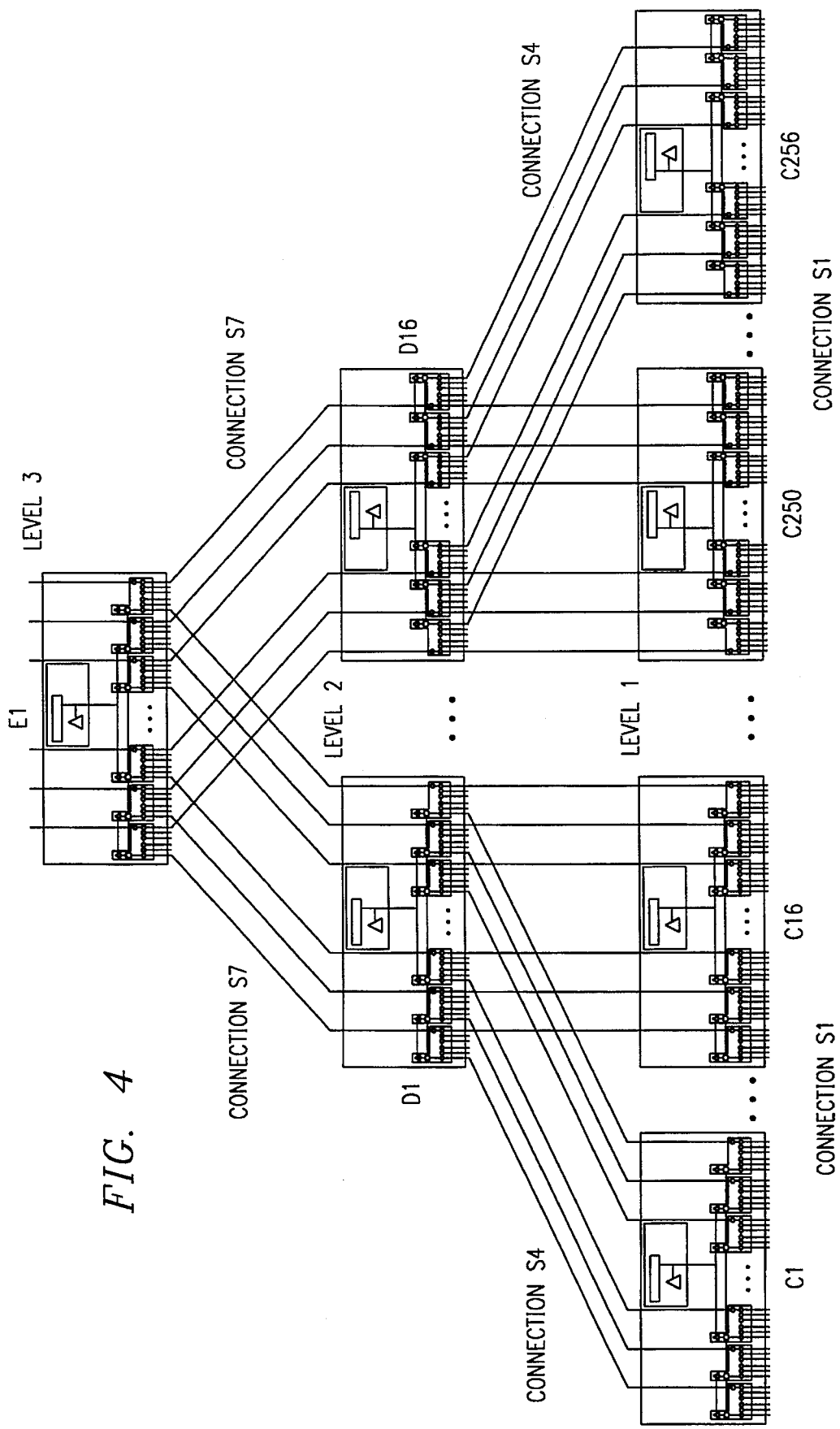
FIG. 4 is a block diagram of three levels mother boards in a tree architecture.

FIG. 4 is an example of a three level tree. A packet of information is sent to its destination by passing it from one level to another until the final destination is reached. For every set of sixteen mother boards, an extra mother board is required to have the set of sixteen mother boards communicate with each other. This extra mother board is connected to every one of the original sixteen mother boards. As mentioned before, Connection S4 is used to connect each printed circuit board to the next higher level in the tree. There are sixteen Connection S4 lines from each mother board (one from each printed circuit board) to the next higher level. Each one of these sixteen lines is connected to a different printed circuit board in the next higher mother board. There are a total of 256 lines (16 mother boards at the first level×16 printed circuit boards on each mother board) coming into each mother board at the second level. There a total of 256 mother boards at the fast level and a total of 16 mother boards are at the second level. Only one mother board is required for the third level. The third level connects the sixteen mother boards at the second level using the same method as in the lower levels.

Connection S4 provides a routing system for the set of mother boards at the fast level. Connection S4 also provides a level of fault tolerance because them is an alternate path connecting each printed circuit boards within each mother board. If Connection P2 were to malfunction, the printed circuit boards could communicate to each other by going through Connection S4, through the printed circuit board at that level, and then back through the Connection S4 to the correct printed circuit board at the first level. Similarly, if a malfunction happens at one of the Connection S4s, the information can be sent through Connection P2. As long as both levels (on the same mother board) are not malfunctioning at the same time, failure of one of them will not cause the network to be down because of the alternate routes. In addition, if any one of Connection S1s malfunctions, only that unit is disabled, and the other PostSPs on that board are functional.

Message Organization

A message is divided up to 8K byte packets. Each packet is made up of 32-bit, 16-bit and 8-bit segments:

1) three 32-bit words (12 bytes) specifying the destination address and broadcasting type.

2) three 32-bit words (12 bytes) specifying the source address.

3) a 16-bit word (2 bytes) specifying the transport protocol.

4) a 16-bit word (2 bytes) specifying the number of bytes in the packet.

5) 0 to (8K minus 28) bytes of user data.

6) a 32-bit CRC (4 bytes—is considered part of user data count).

| 12 bytes | 12 bytes | 2 bytes | 2 bytes | 0 to (8K-28) bytes | 4 bytes |
|---|---|---|---|---|---|
| Destination | Source | Protocol | # Bytes | User Data | CRC |

Network Operation

Figure 5:
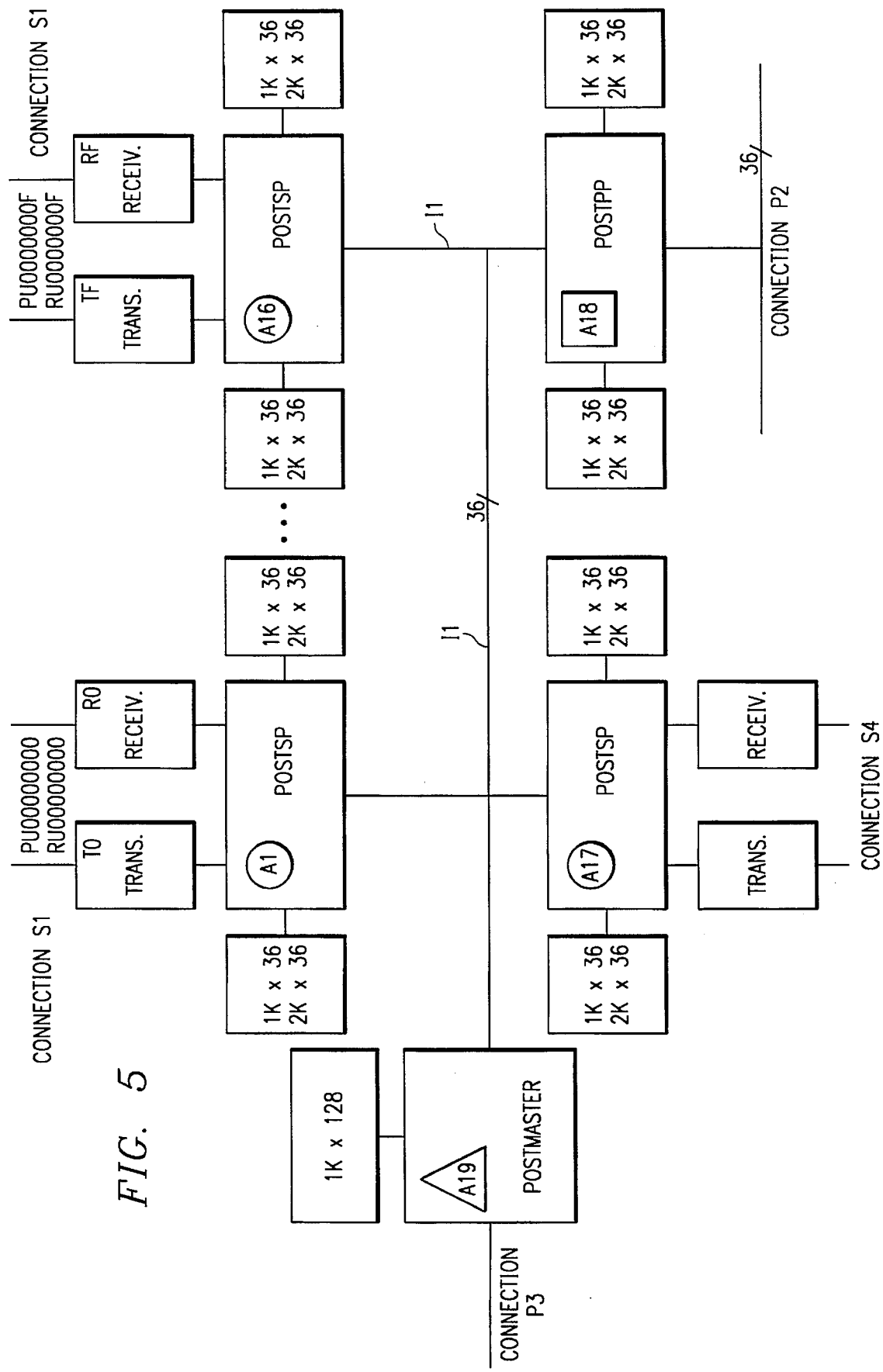
FIG. 5 is a schematic diagram of a printed circuit board of the type in FIG. 1.

FIG. 5 illustrates an embodiment of one of the printed circuit boards and is used to illustrate the following example. PostSP A1 and PostSP A16 are shown in top half of the figure and represent PostSP A1 through A16, but A2 through A15 are not shown to avoid crowding. PostMaster A19 is shown in the right hand side. Additionally, the 17th PostSP, A17, and the PostPP A18 are shown in the bottom half. The PostSPs, the PostPP and the PostMaster are connected by a 36 bit bus, although the bus is not restricted to only 36 bits wide.

Communication between two processing units connected to two PostSPs on the same printed circuit board will be illustrated. In this example, the processing unit is a workstation (but could be any other processing unit) and the receiving unit is the PostSP connected to the workstation. In FIG. 5, the PostSP on the top leftmost is assigned a hex address of 00000000 and the PostSP on the rightmost is assigned a hex address of 0000000F. Suppose PU00000000 (processing unit at hex address 00000000) wants to send a packet to PU0000000F. After assembling the packet in its transmitting buffer, PU00000000 signals its transmitting controller to send the assembled packet. The PU00000000's transmitting controller signals the RU00000000's receiving controller (RU00000000 is the receiving unit—the PostSP for the processing unit PU00000000) that a packet is ready to send. Regardless of the destination address, the RU00000000 accepts the packet from PU00000000 whenever its receiving buffer is empty. When the RU00000000 replies to PU00000000 that it is ready to accept the packet, the PU00000000 starts sending the data. The RU00000000 receives the data and puts it into its receiving buffer R0. If no error occurs during data transmission, the RU00000000 reports back to PU00000000 that the packet is received. The PU00000000's transmitting controller signals its processor that the packet has been sent and it is ready for the next packet. The RU00000000 raises a flag to the PostMaster telling it to move the packet at its receiving buffer R0.

The PostMaster is a microprogram controller and has three main functions. Its first function is to go around checking the PostSPs and the PostPP to see if they have any packets to move. It operates in a round-robin polling scheme and has exclusive control over the 36-bit data bus (4 bits for parity) I1 connecting the PostSPs, the PostPP and the PostMaster.

Its next function is routing the packet. The PostMaster has a unique hex address varying in number of bits from 4 to 28, depending on its location at the tree level. FIG. 5 also shows another 36 bit data bus P2 located on the mother board. One bus I1 is controlled by the PostMaster, as discussed in the preceding paragraph, and the other (Connection P2) is controlled by the State PostMaster on the CPU board (B17 in FIG. 3—the CPU board B17 is the seventeenth board on the mother board). Connection P2 is attached to each of the sixteen PostPPs on the sixteen printed circuit boards. The address of this PostMaster on the seventeenth printed circuit board can be used as the address of the mother board. All addresses of the PostMaster are hardwired at its mother board and one large LED display at the top of the mother board can be used to display the address in hex for visual identification. Additionally, the display may indicate trouble at a printed circuit board by flashing its address on the display. With this address organization, routing packets is possible in both hardware and microinstructions (and is described in detail in the next two sections). If for any reason a packet can not be routed to its destination, the PostMaster can return the packet to its original sender by replacing the destination address with the source address in the packet.

The PostMaster's third function is moving a packet receiving buffer from one PostSP or PostPP to the transmitting buffer of another PostSP or PostPP. Implementing the PostMaster, PostSP and PostPP in VLSI devices, saves printed circuit board area and makes the moving algorithm more efficient and flexible. The PostMaster is able to move a packet at a very high rate from one transmitting buffer of one PostSP or PostPP to the receiving buffer of another PostSP or PostPP. The PostMaster is may also copy the receiving buffer to the transmitting buffer of the same PostSP or PostPP. Recalling from our above example, the packet from the PU00000000 was stored in the receiving buffer R0 of the RU00000000. The receiving buffer R0 is not really a two port memory, but it can get accessed from either the PostSP RU00000000 or the PostMaster A19. Once the RU00000000 raises a flag to the PostMaster A19, it also gives the PostMaster A19 the right to access its buffer. The transmitting controller of the PostSP and the PostPP act similarly. Once the packet has been successfully transmitted, the PostMaster A19 gets access right to its buffer. When the PostMaster A19 polls the RU00000000 and finds its flag, it services the RU00000000 by first fetching the destination address from the packet. Using its routing algorithm, it finds the target buffer, which is the transmitting buffer TF of the RU0000000F in this example. If the transmitting buffer TF of the RU0000000F is empty, the PostMaster A19 starts moving the packet from receiving buffer R0 of RU00000000 to the transmitting buffer TF of RU0000000F. After a successful transfer, the PostMaster has two more tasks: 1) it signals the RU00000000 receiving controller that the packet has been moved, and gives the buffer's access right back to RU00000000 so it can receive more data from PU00000000; and 2) it also gives the buffer's access right to the RU0000000F's transmitting controller and instructs it to send the packet in its buffer to PU0000000F. Then, the PostMaster restarts its usual round-robin polling scheme by visiting the next PostSP or PostPP. Sending a packet from RU0000000F to PU0000000F uses the same protocol as sending a packet from PU00000000 to RU00000000. The packet is now at the PU0000000F. The two processing units PU00000000 and PU0000000F are responsible for the acknowledgement signal.

The PostSP's at the bottom-most of the tree are connected to the processing units and have their own hex address. The seventeenth PostSP and PostPP serve the routing algorithm of the PostMaster. First, the PostMaster determines the destination from the destination address fetched from the packet. From the network architecture, the 32 bit hex address can be broken up into three parts: 1) the twenty four most significant bits are for decoding the mother board; 2) the next lower four bits decode to one of the sixteen printed circuit boards; and 3) the least significant nibble (4 bits) decode to one of the sixteen PostSPs. The routing hardware compares the mother board address portion of the destination address against its hardwired address. If they differ from each other, the router will choose the seventeenth PostSP for the target and move the packet to its buffer. The serial ports of this PostSP are connected to a higher level of the tree. The protocol for all serial communication is the same regardless the location of the tree level. If the mother board address in the destination is the same as in the source address, the PostMaster decodes the next lower nibble (bits 4–7) to select one of its 16 printed circuit boards. The PostPP is then used to transfer the packet between two printed circuit boards that are located in the same mother board.

The shortest route between a source and a destination is two serial and one parallel line. The best latency is also two serial and one parallel transfers.

SECTION 2. PostSP, PostPP

Serial Interface

Each processing unit (workstation) communicates with the remote unit (PostSP) via a point-to-point fiber optic media. The data encoding scheme is based on the ANSI X3T9.5(FDDI) committee's 4B/5B code. An ANSI X3T9.5 splits the 8 bit parallel data pattern into two 4 bit nibbles. Each nibble is further encoded into a 5 bit symbol. Sixteen out of the thirty two possible patterns formed from the 5 bit symbol are used to represent the 16 patterns of the 4 bit data. Some of these 5 bit patterns are combined to form eleven patterns of a 10 bit command. The encoding scheme and the NRZI data format ensures at least two transitions per symbol and allows three consecutive non-transitions for the 10 transmitted bits.

Functional Characteristics

Figure 6:
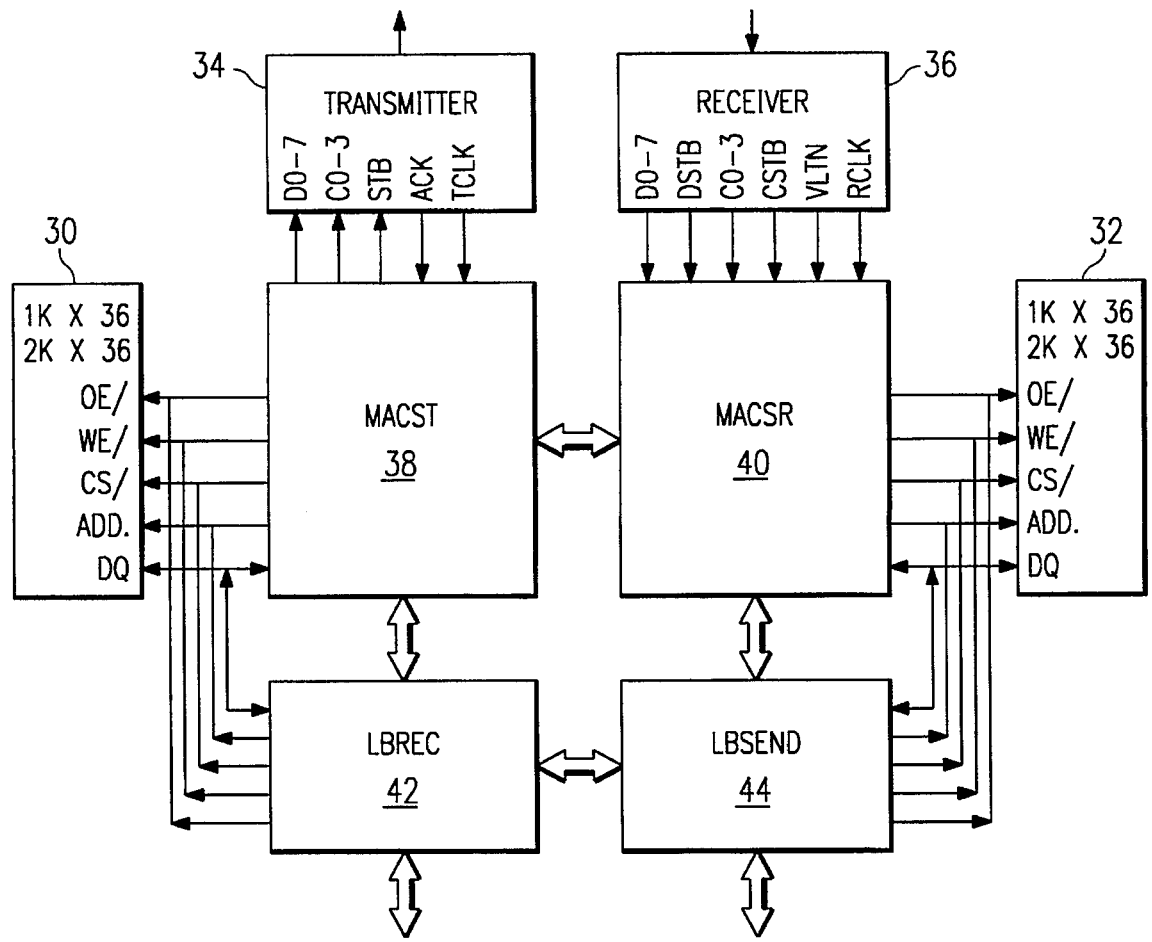
FIG. 6 is a schematic diagram of a PostSP device.

The PostSP has only one mode of transmission: full duplex mode where data can be transmitted and received at the same time. A command pattern can be transmitted or received anytime, even in the middle of data transmission without any overhead. As shown in FIG. 6, the PostSP has four controllers, MACST 38, MACSR 40, LBREC 42 and LBSEND 44 that are interfaced with each other. The buffer memory 30 is referred to as the transmitting buffer and the buffer memory 32 is referred to as the receiving buffer. The bottom signals of the LBREC 42 and LBSEND 44 are used to communicate with the processor unit or the PostMaster. In normal send operation, the processing unit or PostMaster checks the status of its access right for the transmitting buffer via the LBREC 42 controller. By implementing this kind of protocol, data overrun should never occur. One of three status categories is reported back from the LBREC 42 and MACST 38. The first category means the receiver at the other end is in test mode or inoperative. In this case, the PostMaster will return the packet back to its original source. The processing unit will report this status to the upper layer. The second category is a busy status telling the PostMaster or the processing unit to wait until the previous packet at the buffer is sent. The third category signals the PostMaster or the processing unit that the buffer is empty and ready to accept the new packet. Once the new packet is put into the buffer, the PostMaster or the processing unit gives the access

| Hex Data | 4-bit Binary Data | 5-bit Encoded Symbol | Hex Data | 4-bit Binary Data | 10-bit Encoded Symbol | Command |
|---|---|---|---|---|---|---|
|   |   |   |   | No STB | 11000 10001 |   |
| 0 | 0000 | 11110 | 0 | 0000 | XXXXX XXXXX | user Data |
| 1 | 0001 | 01001 | 1 | 0001 | 11111 11111 | REQ TO SEND |
| 2 | 0010 | 10100 | 2 | 0010 | 01101 01101 | CLEAR-TO SEND |
| 3 | 0011 | 10101 | 3 | 0011 | 01101 01001 | CATCH CRC |
| 4 | 0100 | 01010 | 4 | 0100 | 11111 00100 | END OF MESSAGE |
| 5 | 0101 | 01011 | 5 | 0101 | 01101 00111 | RETRANSMIT |
| 6 | 0110 | 01110 | 6 | 0110 | 11001 11001 | ERROR |
| 7 | 0111 | 01111 | 7 | 0111 | 11001 11001 | NOT FUNCT |
| 8 | 1000 | 10010 | 9 | 1001 | 00100 11111 | MESSAGE ACK |
| 9 | 1001 | 10011 | B | 1011 | 00111 00111 | TEST MODE |
| A | 1010 | 10110 | C | 1100 | 00111 11001 | NORMAL MODE |
| B | 1011 | 10111 |   |   |   |   |
| C | 1100 | 11010 |   |   |   |   |
| D | 1101 | 11011 |   |   |   |   |
| E | 1110 | 11100 |   |   |   |   |
| F | 1111 | 11101 |   |   |   |   |

Command Classification

| | TA = Transmitter A<br>RA = Receiver A | TB = Transmitter B<br>RB = Receiver B | |
|---|---|---|---|
| SEND<br>TA-RB | SEND<br>RA-TA-RB-TB | TB-RA | RB-TB-RA-TA |
| 1. REQ_TO_SEND | 2. CLEAR_TO_SEND | 1. REQ_TO_SEND | 2. CLEAR_TO_SEND |
| 3. CATCH_CRC | 5. RETRANSMIT | 3. CATCH_CRC | 5. RETRANSMIT |
| 4. END_OP_MESS | 6. ERROR | 4. END_OF_MESS | 6. ERROR |
| B. TEST_MODE | 7. NOT_FUNCT | B. TEST_MODE | 7. NOT_FUNCT |
| C. NORMAL_MODE | 9. MESSAGE ACK | C. NORMAL_MODE | 9. MESSAGE_ACK | right back to the PostSP. Normal receiving operations at the other end is also straightforward and data overrun should never occur.

Handshaking is done by several sets of commands through the serial lines. Reception of the packet sent through the serial line is controlled by the MACSR 40. Once the packet is in the receiving buffer 32, MACSR 40 signals LBSEND 44 that a packet has arrived and gives LBSEND 44 the access right to the buffer 32. The following examples are provided to demonstrate the invention.

EXAMPLE 1

Transmit

Transmitter A (TA) and receiver A (RA) reside on the processing unit (Workstation A). Transmitter B (TB) and receiver B (RB) reside on the corresponding PostSP. Workstation A has a file to transfer to another workstation and the packet is already in the transmitter A's buffer.

TA Send a REQ_TO_SEND command and read the first 16 bits (the number of bytes to be sent). Wait for a response from Receiver B.

RB Send CLEAR_TO_SEND to TA, and reset writepointer of the receiving buffer.

TA Reset read-pointer, start sending the packet and calculate the CRC. If no command from RB after exhausting the data from the transmitting buffer, send CATCH_CRC.

RB Receive data, put data in buffer, and calculate CRC. After receiving CATCH_CRC, complete CRC calculation and get ready to compare the calculated CRC against the next 4 bytes from TA.

TA Send the 4 byte CRC. Send END_OF_MESSAGE to RB. Wait for receiving status from RB.

RB Catch the CRC from TA and compare with its own calculated CRC. If CRC is matched, send MESSAGE_ACK. Then signal the remote unit that a packet has arrived in the buffer. The signal will give the access right to the processing unit.

TA After receiving MESSAGE_ACK, signal the upper layer that the packet was successfully sent and ready for the next packet.

EXAMPLE 2

Retransmit

Workstation A has a file to transfer to another workstation (RB & TB) and the packet is already in the transmitter A (TA) buffer.

TA Send a REQ_TO_SEND command and read the first 16 bits (the number of byte to be sent). Wait for a response from Receiver B.

RB Send CLEAR_TO_SEND to TA, and reset writepointer of the receiving buffer.

TA Reset read-pointer, start sending the packet and calculate the CRC. If no command from RB after exhausting the data from the transmitting buffer, send CATCH_CRC.

RB Receive data, put data in buffer and calculate CRC. After receiving CATCH_CRC, complete CRC calculation and get ready to compare the calculated CRC against the next 4 bytes from TA.

TA Send the four byte CRC. Send END_OF_MESSAGE to RB. Wait for receiving status from RB.

RB Catch the CRC from TA and compare with own calculated CRC. If CRC is not matched, send RETRANSMIT to TA.

After receiving RETRANSMIT, TA restarts from first step.

MACSR

The receiver accepts differential signals from the transimpedance amplifier that converts the low current output from the pin diode into an acceptable voltage level. The differential signals, in NRZI format, go directly to a phase locked loop of the receiver where the clock and the data get separated and presented to the byte sync logic block. No significant signal denotes the byte boundary. The byte sync logic block is responsible for establishing the byte boundary from the stream of serial data and for conversion into parallel form. The data decoder takes the parallel form and decodes it into either an 8-bit data pattern or a 4-bit command pattern using the X3T9.5 encoder/decoder scheme. The receiver will pass the 8-bit data pattern or the 4-bit command pattern along with the corresponding strobe to the MACSR.

The MACSR is the media access controller for the receiver. Its main function is to accept and verify the transmitted packet from the other end and to store it in the receiving buffer before notifying the local PostMaster or processing unit to retrieve the packet. The receiver also provides a status signal to the MACSR regarding the validity of the data or command pattern. The MACSR shares the receiving buffer with the PostMaster or the processing unit. The circuitry for the access right is similar to the one shown in FIG. 7, except the RESET/signal is tied to the CLEAR pin of the D flip-flop to give the access right to the MACSR upon power up or system reset.

Figure 8:
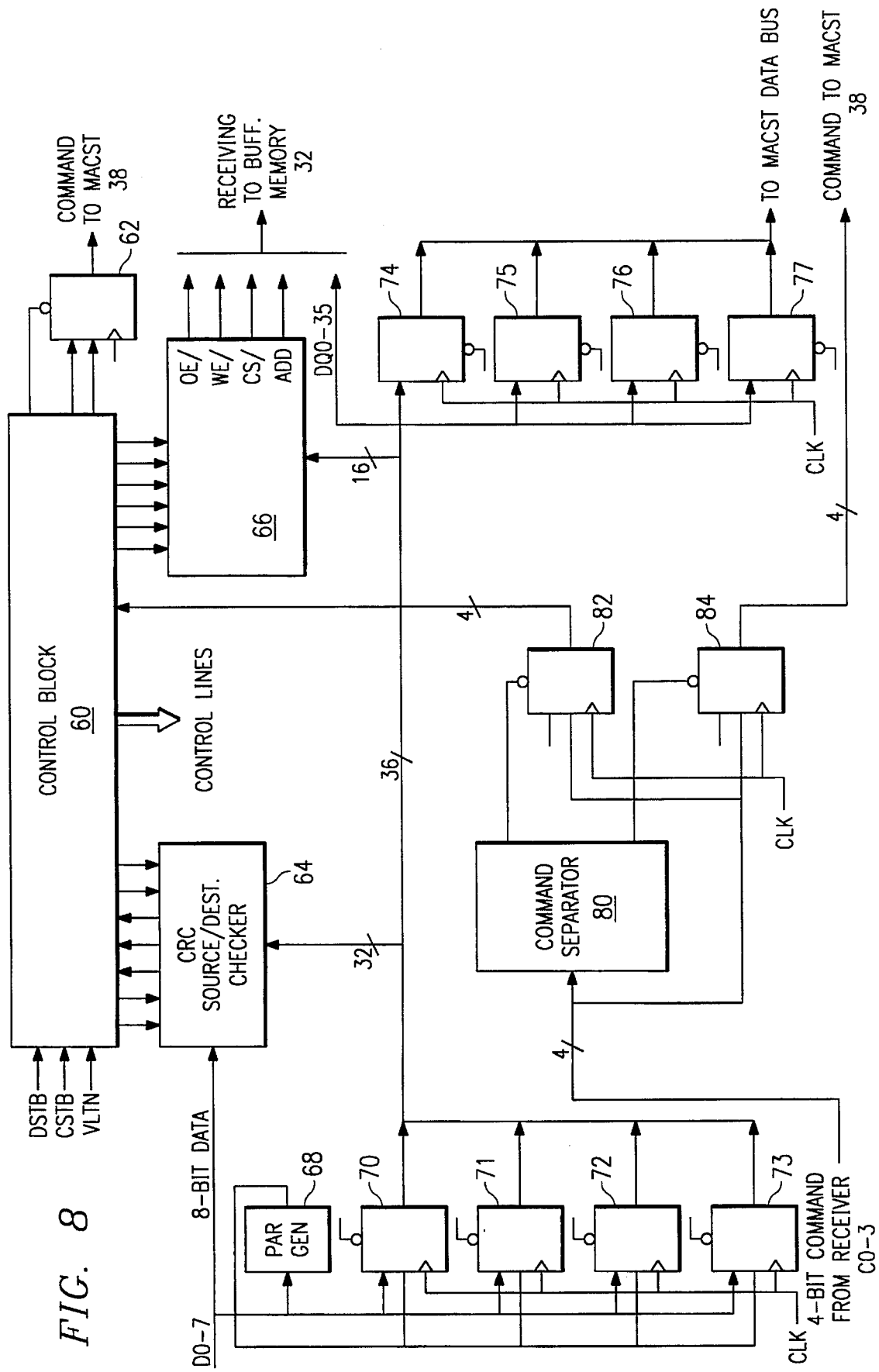
FIG. 8 is a schematic diagram of a MACSR device.

In FIG. 8, the valid 8-bit data D0–7 from the receiver is common input to the four 9-bit flip flops 70–73, the parity generator 68 and CRC checker 64. The ninth input to each flip flop 70–73 comes from the output of the parity generator 68. The control logic provides the 4-byte boundary and the corresponding latch enable for each one of the 9-bit flip flops 74–77. The 32 data outputs of the four 9-bit flip flop 70–73 are also routed to the source/destination address and the CRC checker 64.

The 4-bit command output from the receiver is sorted according to the command table (previously listed) by a simple logic block 80 that will produce two output control signals. Only one of the two control signals is active for a valid command. One of the two control lines is a latch enable 84 for the command that means send to the MACST. The other is also a latch enable 82 for the command sent from the other end (the processing unit) to the MACSR.

The control block 60 of the MACSR is a simple state machine that takes inputs from the LBSEND 44, the command, strobes, status from the receiver and the status bits from the CRC and source/destination address checker 64. At each state, the control block outputs 64 to the buffer memory all the necessary control lines to all the blocks, including the control lines of the address counter (ADD), the chip select (CS/), the write enable (WE/) and the output enable (OE/).

MACST

The transmitter 34 accepts input from two different ports: a data and a command port. The data and command are received in parallel upon receiving the rising edge of the strobe pin, encoded into 4B/5B patterns, formatted into 4B/5B pattern in NRZI format and then serially shifted into serial output. The LED driver, consisting of some passive components, accepts the serial output from the transmitter as input to its output driver amplifier. (The output amplifier can be capable of driving the LED such as the HFBR-1404 from HP.) If all the command inputs are low (0), information on the data inputs will be sent on the rising edge of the strobe pin. Otherwise, a non-zero command will be sent instead of the data on the rising edge of the strobe input. If there is no strobe at the next byte boundary, a SYNC pattern is sent to keep the receiver in sync with the transmitter 34. An acknowledge output signal from the transmitter 34 informs the media access controller 38 that the transmitter 34 is ready to accept new data or a command.

Figure 7:
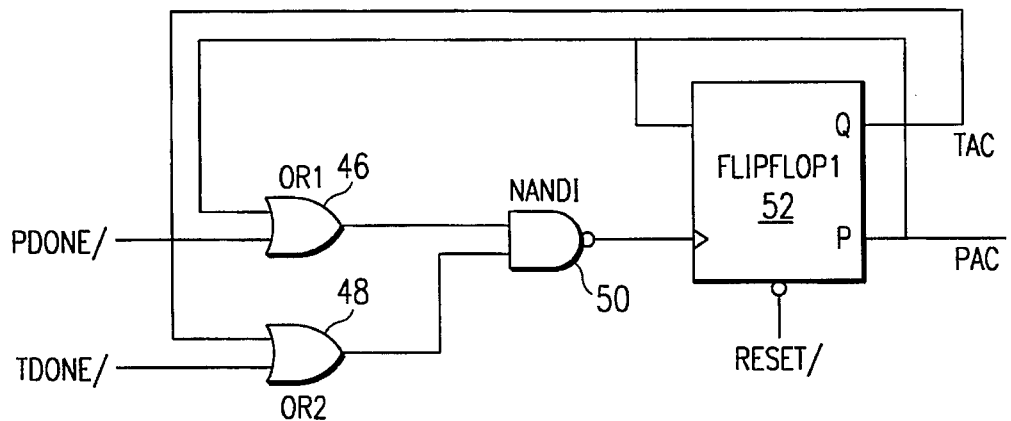
FIG. 7 is a circuit diagram in a PostSP device.

The MACST 38 is the media access controller for the transmitter 34. Its main function is to take a transmit command from the PostMaster or processing unit via the LBREC 42 and to execute the transmitting task. Six status lines regarding the state of the receiver at the other end are provided to the LBREC 42. The MACST 38 and LBREC 42 pass the access right to the transmitting buffer 34 back and forth by one D flipflop 52, two 2-input OR gates 46, 48 and one 2-input NAND gate 50 as shown in FIG. 7. When the Q output of the flipflop 52 is low, the MACST 38 has the access right to the transmitting buffer 34. A low Q output also serves as the transmitting command from the LBREC 42. Once the transmitting task is successfully completed, the MACST 38 always gives the access right back to the LBREC 42 by pulsing the TDONE/ signal once. The preset pin of the D flip flop is tied to the master reset so that the access right is given to the LBREC upon power up or system reset. Once the MACST 38 has the access right to the transmitting buffer 30, it outputs the address (ADD.), the chip select (CS/), the read/write (WE/) and the output enable (OE/) to the buffer memory 30. The buffer memory's 36 read lines are latched to four 9 bit bus interface flipflops where the flipflops are distributed to the rest of the logic blocks. The logic blocks are the parity checker, and the 32 bit CRC calculation block and source/destination address checker. The lower sixteen bits of this bus are latched by the 16 bit byte counter, then the third 32 bits are read. Note that the internal bus is a 32-bit bus and 4 parity bits for those four bytes of data. These four outputs from the parity checkers are reflected on the rest of the four outputs of the status lines to LBREC. Eight 4-to-1 mux latches are used to multiplex 32 bits of data before passing it to the transmitter (since the transmitter itself takes only eight bits of data at a time for encoding and serializing). The 36 outputs of the four 9 bit flip-flops from the bus interface are also tied to 36 outputs of another four 9 bit flipflops 74–77 from the MACSR which in turn take input from the read data line of the receiving buffer. This is the same method that the PostSP returns a non-deliverable packet if it is still in the receiving buffer and the PostMaster or the processing unit is not able to retrieve it.

The MACST also has a 4-bit output (C0–3) for sending the command to the transmitter. The 4-bit command comes from the control block of either the MACST or the MACSR (from flipflop 62 in FIG. 8). Another four command inputs and a strobe from the MACSR (from flipflop 84 in FIG. 8) go directly into the input of the MACST control block. The command input stream from the transmitter of the other end is decoded by the MACSR (decoded by command separator 80 in FIG. 8). The command can originate from the receiver or the transmitter of the other end (see command encoding/decoding). The MACSR can determine the source and destination of the received command. But, the MACSR requires the MACST to send a reply command to the transmitter of the other end and also deliver a reply command from the receiver of the other end point.

The control block of the MACST is a simple state machine that has inputs from the LBREC, the transmitter and the MACSR. At each state, it outputs all the necessary control lines to the blocks as described above.

LBREC and LBSEND

The LBREC and LBSEND are the interface blocks between the MACST and the MACSR and the PostMaster or the processing unit. The Imode pin of the PostSP selects the type of interface device. If this pin is connected to VCC, the external address lines are used to access the two buffer memories, otherwise the internal address counter is used. This pin should always be connected to VCC when the PostSP is on the microprocessor board. The minimum number of signals that are used in the PostSP-microprocessor interface are 11 address, two chip select, two output enables and one write enable line. Two active low signals are also required to pass the buffer memory access right to the MACST and MACSR. Three interrupt and one interrupt mode lines are used to interrupt the processor for requesting the transfer of the buffer memories. When the Imode pin is connected to ground, the PostSP is used with the PostMaster at the remote unit. There are 6 address identification lines (SL5–0) that the PostMaster uses to address one of the PostSPs or the PostPP. The source or destination address strobe is for selecting either the transmitter or the receiver. SL5–4 are decoded to select either one of the 16 PostSPs, the 17th PostSP, the PostPP or to deselect them all. The lower 4 address identification bits (SL3–0) are used to select one of the 16 PostSPs if SL5 and SL4 are both low. Three broadcast control lines in addition to the address identification lines, select all or a group of the PostSP and PostPP to receive the packet. The PostSP and the PostPP use these six address, one broadcast control line from the PostMaster, and the six input lines that are hardwired at the printed circuit or mother board to communicate its situation to the PostMaster. The LBREC and LBSEND both have one 16-bit address counter to access its buffer memory. Resetting and incrementing the memory address counter is controlled by the PostMaster.

PostPP

Figure 9:
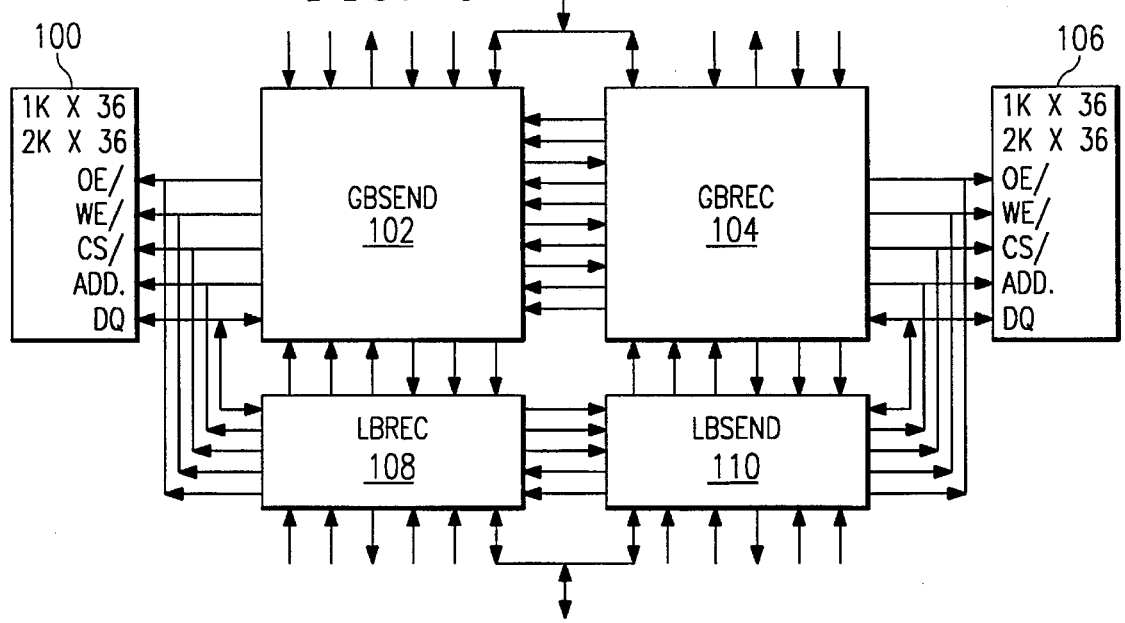
FIG. 9 is a schematic diagram of a PostPP device.

The PostPP is the least complex chip of the three VLSI devices. Shown in FIG. 9, the PostPP is composed of LBREC-LBSEND 108, 110 and GBREC-GBSEND 102, 104 blocks. The GBREC 102 and GBSEND 104, as well as the LBREC 108 and LBSEND 110, have the same number of signals and functions as the LBREC and LBSEND described above in relation to the PostSP. Similarly, the memory buffers function the same as the memory buffers in the PostSP described above.

SECTION 3. PostMaster

Figure 10:
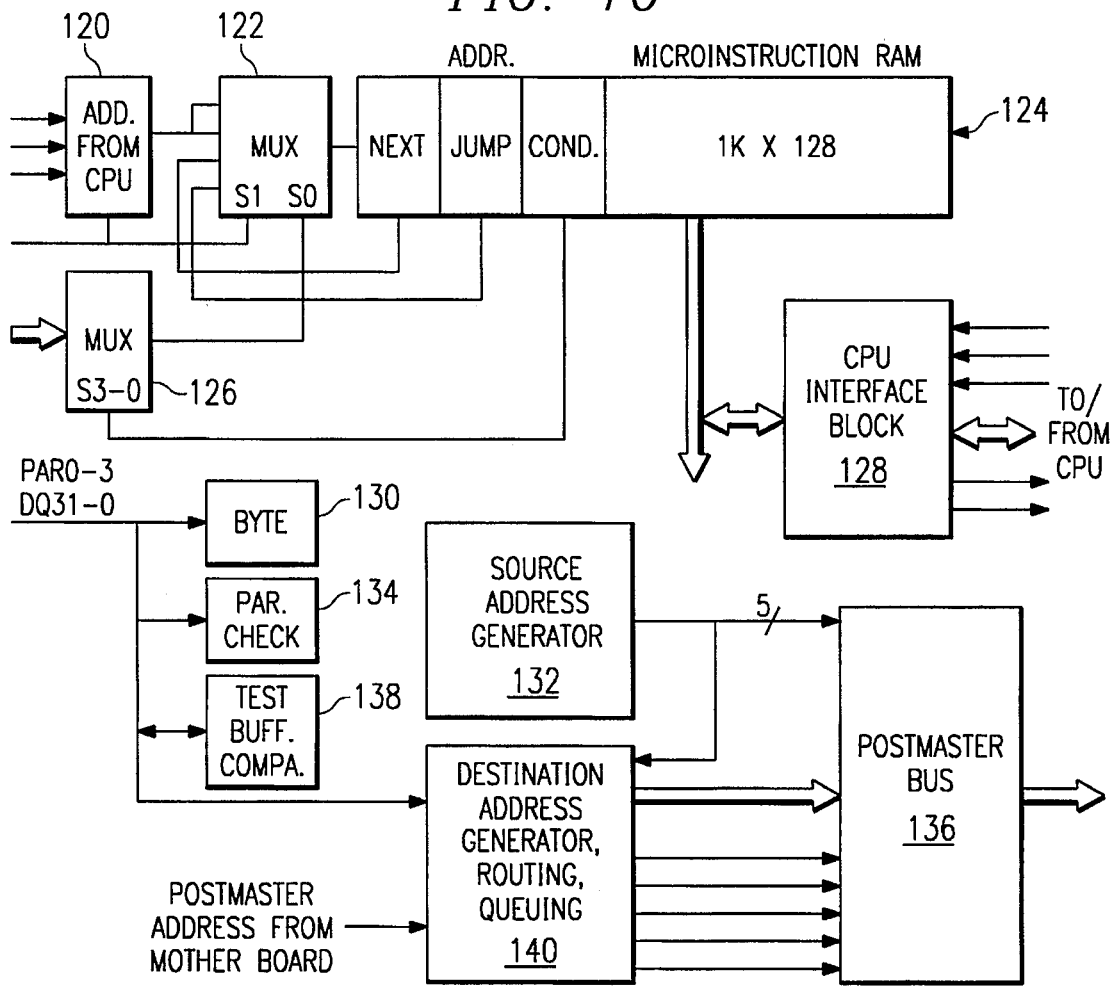
FIG. 10 is a schematic diagram of a PostMaster device.

Even though some of the functions of the PostMaster have already been mentioned, other characteristics are described in greater detail. FIG. 10 depicts some attributes of the PostMaster. In every mother board, there is a total of seventeen PostMasters, one on each of seventeen printed circuit boards. The fast sixteen printed circuit boards have local PostMasters, and the seventeenth printed circuit board has a State PostMaster. A single board computer with a 32-bit microprocessor controls the State PostMaster, even though the PostMaster itself can be a microcontroller. The microprocessor communicates to all the PostMasters through a 32-bit bidirectional bus (Connection P3 in FIG. 3). Twenty one address lines from the microprocessor along with a few control lines are used to access the microinstruction RAM 124 and the registers of anyone of the PostMasters. The microprocessor's primary role is to load the microinstruction RAM of the PostMaster that is stored in its PROM and monitor the state of each one of them. Its secondary role is diagnostic, since it can control the PostMaster and put anyone of the PostMasters in one of the six operating mode: Soft-Reset, Pause, Continue, Run, Run-Monitor and Test mode. In the Run-Monitor mode, the PostMaster will provide the microprocessor with the header of the packet (number of bytes, source and destination) and another 32 bit status for each transfer job. This mode might affect the throughput of the network, but it provides a way to measure the network performance and to gather statistical data about movement on the parallel bus.

FIG. 10 also shows the functional blocks of the PostMaster. The source address generator 132 has a 5-bit counter that will be used to select one of the PostSPs or PostPPs. It counts only from 0 to 17 if the WMODE pin is connected to VCC. If this pin is connected to GND, the counter will count from 0 to 15 to select one of the 16 PostPPs from the 16 printed circuit boards. The five outputs of the counter are encoded in 6 bits before sending to the SL5–0 bus. Once the source address and its strobe are sent out, the PostMaster will wait for acknowledgement from the PostSP or PostPP. If the PostSP or PostPP does not respond within 5 clock cycles, the PostMaster will assume that the PostSP or PostPP does not need its service at this time. It will then increment its source address counter and check its queue counter to see if it should use the source address from the queue or from the source address counter as its next visit. If the PostSP or the PostPP has a packet to be moved out of its buffer memory, the PostMaster will fetch the destination address from the packet in the receiving buffer, and use its routing algorithm to determine the target device. If no device in the queue is waiting for this target, the PostMaster will send the destination address out on the SL5–0 bus along with a strobe. The target device should acknowledge within 5 clock cycles if its buffer is free. The PostMaster also checks the status lines to determine the state of the target device. If the target device is still operational and its buffer memory is free, the PostMaster will start its moving operation. If the buffer of the target device is not free, the PostMaster will not wait until this buffer is free. It will push the source address in the queue and continue its poll with the next source address.

The rest of FIG. 10 details an example implementation of the PostMaster. Addresses from the CPU go into circuit 120 which in turn input into multiplexer 122. The address would then input into microinstruction RAM 124, along with microinstructions from multiplexer 126 and CPU interface block 128. Data comes into the PostMaster and divided by circuit 130, parity checker 134, and test buffer comparer 138 before the data goes into the destination address generator, router, and queue block 132. The PostMaster Bus 136 gets input from the destination address generator, router, and queue block 132 as well as the source address generator 132. The destination address generator, router, and queue block 132 also gets PostMaster addresses from the mother board.

The network and the PostMaster are designed without priorities. Every processing unit in the network gets a fair amount of service. Queuing is the closest method that can implement this concept, but requires a fair amount of static RAM and an abundance of control lines. An example queue block diagram is shown in FIG. 11. The static RAM that is used to store the source in the queue is a 1K×5 block. There are three identical register files 152, 160, 172 organized as 32×5 bits and only locations 0 to 17 are used in the present embodiment. Each location of the register files 152, 160, 172 represents the transmitting buffer of each PostSP or PostPP. A register file can be addressed simultaneously by a destination address, the push pointer, the pull pointer, and the number of queue devices waiting for this buffer to be free. The data outputs of each register file are input to their corresponding 5-bit up/down counter 154, 162, 174. Depending on the successfulness of each operation, the counters are either independently incremented, decremented or held at the present value before their outputs are written back to the register files. The push or the pull pointer is concatenated with the destination address to put a source in the queue 158 or to retrieve it from the queue. A 5 bit up/down counter 180 and a 5 input OR gate 182 are included in the queue hardware to have a queue status. The queue status allows the queue search to be aborted as soon as all eighteen queues are empty. To help the PostMaster look for forgotten customers in the queue, a 5-bit counter 184 is used in the searching. The 5-bit source address from the queue RAM 158 is used to address a 32×4 register file 164. The contents of the register file 164, along with counter 66 and NAND gate 168, serve as a timer to the PostMaster for each customer in the queue. The contents of the register file 164 is the number of attempts that the PostMaster tried to service the address, but the destination failed to accept the transfer without any indication of hardware failure. If the number of attempts is equal to 15, the PostMaster will return the packet back to the original source.

The usual route between a source and a destination address, with no hardware failure, has been described. As mentioned earlier, a hardware failure at Connection P3 or Connection S4 does not cause a packet (with a regular route including that connection) from reaching its final destination. The absolute difference between the source and the destination addresses determines the number of levels that the packet has to travel on the regular route before reaching the destination. If Connection P3 has a hardware failure, the only method left to locally send a packet from one source to a destination with absolute difference less than 256 and greater than 16 is to send it through Connection S4. If Connection S4 is down and the absolute difference between a source and a destination is greater than 256, the PostMaster at the source address's board will choose Level P3 as an alternate route; one of its 15 neighbors will have to take the burden of accepting this packet and sending it to the higher level in the tree.

The rest of FIG. 11 shows an example implementation of elements that could be used to effectuate the queue. Destination addresses arrive at multiplexer 170 and are processed through the register files 152, 160, or 172. Counter 178 inputs into multiplexer 170 and counters 180, and 184, along with OR gate 182 provide a check for the queue. Register files 152 and 160 input into their respective counters 154, and 162 which then input into multiplexer 156 before input into the queue 158. Counters 154 and 162 can also push and pull back into the register files 152 and 160. In addition, register file 172 inputs into counter 174, which in turn inputs into OR gate 176 to provide a NOQN/ signal when necessary.

SECTION 4. SUMMARY

The type of network controller described above is a modified high speed switching mechanism and closest to an ideal switch. Implementing the ideal switching network using a crossbar switch with thousands of processing units is not possible in the near future even with the high rate of progress in technology. In the ideal switch, once two points are connected together, it is very hard for a third one to break into either one of them because there is no provision to tell the switch controller that the two units are in session or taking a nap. The above network acts as a temporary switch and allows any number of its processing units to use the same target once a packet is transmitted and received. The network would also allow two units to contact each other again in a short period of time. Parallelism, high speed bus and hardware recursion are implemented at every level of the tree. Every 256 units have 16 independent serial channels that can be used to simultaneously transmit or receive the packets to or from other units which do not belong to their group. Within their group, 16 parallel independent channels are 16 to 25 times faster than the serial one, and will meet most throughput requirements. In efforts to localize the network, the 256 units are further divided into 16 subgroups of 16 printed circuit boards each with 16 independent parallel channels to move the packet from one unit to another within its subgroup. Hardware recursion propagates from this point upward through each level of the tree.

SECTION 5. EXAMPLE IMPLEMENTATIONS

The VLSI devices can be designed and built to interface with the 64-bit microprocessors and the 200–400 Mbaud fiber optic components. The ECL 1/0 from TI can be utilized with fiber optic technology. The 100K BiCMOS gate array has 256 ECL, TTL 1/0 buffer, and 1K×128 bit fast static RAM. Internal high speed static RAM would be feasible for these devices since it can reduce the pin count for each device from 160 to 88 pins.

In addition, silicon on silicon, enables a subgroup of sixteen ports to be incorporated on a single silicon substrate instead of on one large printed circuit board.

The present invention is an alternative to other controllers for fiber optic such as the VME bus product that can deliver only 35–40 Mbaud throughput. The VME bus is designed around the AMD SuperNet for use on a token ting network. The low throughput and the token ting network will not meet future requirements. For the token ring network, the throughput is almost inversely proportional to the total number of nodes in the network. Using the same rate of data transmission as the token ring network, the present invention can have up to 256 times more throughput for 256 nodes.

Another application of the present invention is disk array technology. Disk arrays comprise of several disk drives used to store an equal number of fragments from a single file in parallel. The present invention will substantially increase the disk transfer rate over a single disk drive.

Using the present invention with very high speed fiber optics will enable high speed graphics to be transmitted and virtually eliminate the need for sophisticated workstations on every desk.

Multiprocesser and parallel computers with 8 to 16 single board computers sharing several smart disk arrays would also benefit from the present invention. One of the three VLSI chips could be used as a mailbox for each single board computer and the smart disk controller. A second chip would be needed to connect each one of the single board computers to the network. A PostMaster on each mother board could deliver the mail 5 to 10 times faster than any microcontroller or DMA device available in the market.

Specifically, the invention could also be combined with the neural network described in patent application Ser. No. 08/092,376, filed Jul. 15, 1993, by Gary A. Frazier. For example, the present invention can utilize its PostSPs to connect all the processing modules described in Frazier. In addition, the PostSPs can also be modified to utilize a local bus instead of the S1 serial connections. Various modifications and combinations of the present invention and Frazier's neural network would be useful and obvious to those skilled in the art and are intended to be encompassed within the spirit of the invention.

Another application is Xwindows where the PostSP devices can be used on the server and the host for point to point communication. Assuming the server has at least a microprocessor and a graphic processor with display memory in it, there are three advantages over the Ethernet chipset. The first advantage is the speed: data transfer rate of the fiber optic is 10 times faster than of the Ethernet. The second advantage is the handshake between the server and the host. For applications that involves heavy graphic display and process, the host might send the graphic command or data faster than the server can process them. The PostSP has a built-in handshake protocol that is more sophisticated than Ethernets. The PostSP will also save host CPU time. Most graphic application programs on the host involve graphic processing of data already in the display memory. Graphic processing can be done either by the server or the host itself. In either case, heavy data transfer and handshaking is involved. Also, a host must have at least 5 to 100 times more processing power than the server. The Ethernet that ties all the servers and the host on a passive bus might be economical, but it will not meet the high speed demand of the user application. With 16 PostSPs or more on single board, sixteen or more servers can be connected to host and only one slot is taken away from the host mother board. The host might also need one of the ports to connect itself to the network.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of communications for a data and computer communications network, wherein said network includes a master system board with a plurality of subsystem boards, said method comprising:

transmitting informational packets to a network node from a first serial communications device through a serial communications bus, wherein said first serial communications device resides on a first subsystem board of said plurality of subsystem boards;

receiving informational packets to said network node from said first serial communications device through said serial communications bus;

transmitting and receiving informational packets from said first serial communications device to a second serial communications device through a first parallel communications bus; and transmitting and receiving informational packets from said first serial communications device to a third serial communications device on a second subsystem board of said plurality of subsystem boards through a second parallel communications bus;

wherein said transmitting and receiving informational packets from said first serial communications device to said third serial communications device on said second subsystem board of said plurality of subsystem boards includes routing said informational packets by a first local router on said first subsystem board and a second local router on said second subsystem board;

wherein said routing said informational packets includes routing said informational packets by a parallel communications bus connecting said first local router and said second local router.

2. The method of claim 1, wherein said transmitting and receiving informational packets from said first serial communications device to said second serial communications device includes routing said informational packets by a first local router on said first subsystem board.

3. The method of claim 1, wherein said transmitting and receiving informational packets from said first serial communications device to said third serial communications device on said second subsystem board of said plurality of subsystem boards includes routing said informational packets by a first master router on said first subsystem board and a second master router on said second subsystem board.

4. The method of claim 3, wherein said routing said informational packets includes routing said informational packets by a parallel communications bus connecting said first master router and said second master router.

5. The method of claim 1, wherein said transmitting and receiving informational packets from said first serial communications device to said second serial communications device includes routing said informational packets by a first local router on said first subsystem board and wherein said transmitting and receiving informational packets from said first serial communications device to said third serial communications device on said second subsystem board of said plurality of subsystem boards includes routing said informational packets by a first master router on said first subsystem board and a second master router on said second subsystem board.

6. The method of claim 1, wherein said method further includes:

transmitting and receiving informational packets from said second serial communications device to a fourth serial communications device on a third subsystem board through a second serial communications bus.

7. A method of communications for a data and computer communications network, wherein said network includes a master system board with a plurality of subsystem boards, said method comprising:

transmitting informational packets to a network node from a first serial communications device through a serial communications bus, wherein said first serial communications device resides on a first subsystem board of said plurality of subsystem boards;

receiving informational packets to said network node from said first serial communications through said serial communications bus;

transmitting and receiving informational packets from said first serial communications device to a second serial communications device through a first parallel communications bus; wherein said transmitting and receiving informational packets from said first serial communications device to said second serial communications device includes routing said informational packets by a first local router on said first subsystem board; and transmitting and receiving informational packets from said first serial communications device to a third serial communications device on a second subsystem board of said plurality of subsystem boards through a second parallel communications bus; wherein said transmitting and receiving informational packets from said first serial communications device to said third serial communications device on said second subsystem board of said plurality of subsystem boards includes routing said informational packets by a first master router on said first subsystem board and a second master router on said second subsystem board.

8. A method of communications for a data and computer communications network, wherein said network includes a master system board with a plurality of subsystem boards, said method comprising:

transmitting informational packets to a network node from a first serial communications device through a serial communications bus, wherein said first serial communications device resides on a first subsystem board of said plurality of subsystem boards;

receiving informational packets to said network node from said first serial communications through said serial communications bus;

transmitting and receiving informational packets from said first serial communications device to a second serial communications device through a first parallel communications bus; wherein said transmitting and receiving informational packets from said first serial communications device to said second serial communications device includes routing said informational packets by a first local router on said first subsystem board;

transmitting and receiving informational packets from said first serial communications device to a third serial communications device on a second subsystem board of said plurality of subsystem boards through a second parallel communications bus; wherein said transmitting and receiving informational packets from said first serial communications device to said third serial communications device on said second subsystem board of said plurality of subsystem boards includes routing said informational packets by a first master router on said first subsystem board and a second master router on said second subsystem board; and transmitting and receiving informational packets from said second serial communications device to a fourth serial communications device on a third subsystem board through a second serial communications bus.

* * * * *